(12) United States Patent
Kim et al.

(10) Patent No.: US 9,287,470 B2
(45) Date of Patent: Mar. 15, 2016

(54) WAVELENGTH-CONVERTING LIGHT EMITTING DIODE (LED) CHIP AND LED DEVICE EQUIPPED WITH CHIP

(71) Applicant: SAMSUNG ELECTRONICS CO., LTD., Suwon-si, Gyeonggi-do (KR)

(72) Inventors: Yong Tae Kim, Gyunggi-do (KR); Dong Yeoul Lee, Gyunggi-do (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/600,741

(22) Filed: Jan. 20, 2015

(65) Prior Publication Data

US 2015/0137168 A1 May 21, 2015

Related U.S. Application Data

(62) Division of application No. 14/176,981, filed on Feb. 10, 2014, now Pat. No. 8,963,187, which is a division of application No. 13/002,318, filed as application No. PCT/KR2009/003647 on Jul. 3, 2009, now Pat. No. 8,680,550.

(30) Foreign Application Priority Data

Jul. 3, 2008 (KR) .................. 10-2008-0064381
Aug. 29, 2008 (KR) .................. 10-2008-0085556
Jul. 3, 2009 (KR) .................. 10-2009-0060596

(51) Int. Cl.
*H01L 33/50* (2010.01)
*H01L 33/54* (2010.01)
(Continued)

(52) U.S. Cl.
CPC ............ *H01L 33/504* (2013.01); *H01L 33/502* (2013.01); *H01L 33/505* (2013.01);
(Continued)

(58) Field of Classification Search
CPC ....... H01L 33/504; H01L 33/54; H01L 33/56; H01L 33/58
USPC .................. 257/98, 100, E33.061; 438/27, 29
See application file for complete search history.

(56) References Cited

U.S. PATENT DOCUMENTS 5,959,316 A 9/1999 Lowery
6,372,608 B1 4/2002 Shimoda et al.
(Continued)

FOREIGN PATENT DOCUMENTS

CN 1812092 A 8/2006
JP 09-153645 6/1997
(Continued)

OTHER PUBLICATIONS

Chinese Office Action, and English translation thereof, issued in Chinese Patent Application No. 200980126051.6 dated Oct. 10, 2012.

(Continued)

*Primary Examiner* — Allan R Wilson
(74) *Attorney, Agent, or Firm* — McDermott Will & Emery LLP

(57) ABSTRACT

A wavelength-converted light emitting diode (LED) chip is provided. The wavelength-converted LED chip includes an LED chip and a wavelength-converted layer. The LED chip emits light in a predetermined wavelength region. The wavelength-converted layer is formed of a resin containing phosphor bodies of at least one kind which convert a portion of the light emitted from the LED chip into light in a different wavelength region. The wavelength-converted layer is formed on an upper surface of the LED chip, and has a convex meniscus-shaped upper surface.

6 Claims, 3 Drawing Sheets

(51) Int. Cl.
    *H01L 33/56* (2010.01)
    *H01L 33/58* (2010.01)

(52) U.S. Cl.
    CPC .............. *H01L33/508* (2013.01); *H01L 33/54* (2013.01); *H01L 33/56* (2013.01); *H01L 33/58* (2013.01); *H01L 2224/45139* (2013.01); *H01L 2224/48091* (2013.01); *H01L 2224/8592* (2013.01); *H01L 2933/0091* (2013.01)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,157,746 B2 | 1/2007 | Ota et al. |
| 7,208,725 B2 | 4/2007 | Sherrer et al. |
| 7,217,583 B2 | 5/2007 | Negley et al. |
| 7,288,758 B2 | 10/2007 | Sherrer et al. |
| 7,319,044 B2 | 1/2008 | Han et al. |
| 7,371,593 B2 | 5/2008 | Harada |
| 7,462,878 B2 | 12/2008 | Richter et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,938,983 B2 | 5/2011 | Mueller-Mach et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2004/0084687 A1 | 5/2004 | Hohn et al. |
| 2004/0166038 A1 | 8/2004 | Braune et al. |
| 2004/0166320 A1 | 8/2004 | Kobusch |
| 2004/0173808 A1* | 9/2004 | Wu ..................... H01L 33/486 257/99 |
| 2005/0093008 A1 | 5/2005 | Suehiro et al. |
| 2005/0135079 A1 | 6/2005 | Yin Chua et al. |
| 2006/0073625 A1 | 4/2006 | Harada |
| 2007/0001178 A1 | 1/2007 | Tran et al. |
| 2007/0045761 A1 | 3/2007 | Basin et al. |
| 2007/0046169 A1* | 3/2007 | Maeda et al. ................ 313/487 |
| 2007/0225465 A1* | 9/2007 | Akiike et al. ................ 528/15 |
| 2007/0228390 A1 | 10/2007 | Hattori et al. |
| 2007/0284999 A1 | 12/2007 | Hsieh et al. |
| 2008/0048200 A1 | 2/2008 | Mueller et al. |
| 2008/0103276 A1 | 5/2008 | Choi et al. |
| 2008/0135862 A1 | 6/2008 | Maeda et al. |
| 2008/0191237 A1 | 8/2008 | Andrews |
| 2008/0203419 A1 | 8/2008 | Harada |
| 2008/0203421 A1* | 8/2008 | Bechtel ................. H01L 33/22 257/99 |
| 2008/0258160 A1 | 10/2008 | Do |
| 2009/0267484 A1 | 10/2009 | Kasakura et al. |
| 2009/0286337 A1 | 11/2009 | Lee et al. |
| 2009/0315053 A1 | 12/2009 | Lee et al. |
| 2010/0155755 A1 | 6/2010 | Dong |
| 2010/0171414 A1* | 7/2010 | Tanikawa et al. .............. 313/502 |
| 2011/0284885 A1 | 11/2011 | Hong |
| 2015/0166342 A1* | 6/2015 | Liu ..................... B82Y 30/00 252/301.6 S |

FOREIGN PATENT DOCUMENTS

| | | |
|---|---|---|
| JP | 2004-158893 A | 6/2004 |
| JP | 2004-260219 A | 9/2004 |
| JP | 2005-340472 A | 12/2005 |
| JP | 2006-060100 A | 3/2006 |
| JP | 2006-114909 A | 4/2006 |
| JP | 2006-135300 A | 5/2006 |
| JP | 2008-218460 A | 9/2008 |
| KR | 10-0669950 B1 | 1/2007 |
| TW | 2007-03710 | 1/2007 |
| WO | 2006-011734 A1 | 2/2006 |
| WO | 2007-005013 A1 | 1/2007 |

OTHER PUBLICATIONS

TaiwaneseOffice Action dated Nov. 14, 2012 issued in Taiwanese Patent Application No. 98122726.
Taiwanese Office Action, w/ English translation thereof, issued in Taiwanese Patent Application No. 098122726 dated Aug. 12, 2013.
Supplementary European Search Report EP 09 77 3757 dated Mar. 19, 2014.
Chinese Office Action, and English translation thereof, issued in Chinese Patent Application No. 200980126051.6 dated Jul. 10, 2012.
Korean Office Action, and English translation thereof, issued in Korean Patent Application No. 10-2009-0060596 dated Sep. 20, 2011.
U.S. Office Action issued in U.S. Appl. No. 13/002,318, dated Jul. 22, 2013.
U.S. Notice of Allowance issued in U.S. Appl. No. 13/002,318, dated Nov. 1, 2013.
U.S. Office Action issued in U.S. Appl. No. 14/176,981, dated Jul. 1, 2014.
U.S. Notice of Allowance issued in U.S. Appl. No. 14/176,981, dated Oct. 16, 2014.

* cited by examiner

WAVELENGTH-CONVERTING LIGHT EMITTING DIODE (LED) CHIP AND LED DEVICE EQUIPPED WITH CHIP

CROSS-REFERENCE TO RELATED APPLICATIONS

This is a Divisional of U.S. application Ser. No. 14/176,981, filed on Feb. 10, 2014, which is a Divisional of U.S. application Ser. No. 13/002,318, filed on May 10, 2011, which is the U.S. National Phase under 35 U.S.C. §371 of International Application No. PCT/KR2009/003647, filed on Jul. 3, 2009, which in turn claims the benefit of Korean Application No. 10-2008-0064381, filed on Jul. 3, 2008, Korean Application No. 10-2008-0085556, filed on Aug. 29, 2008 and Korean Application No. 10-2009-0060596, filed Jul. 3, 2009, the disclosures of which applications are incorporated by reference herein.

TECHNICAL FIELD

The present invention relates to a wavelength-converted light emitting diode (LED) chip, and more particularly, to a wavelength-converted LED chip that can emit white light by mixing original light emitted from the LED chip with secondary light from at least one phosphor excited by a portion of the original light emission, and a wavelength-converted light emitting device having the same.

BACKGROUND ART

A semiconductor LED is known as a next generation light source having the advantages of a long life span, low power consumption, fast response time, high power output, and the like in comparison to a conventional light source, and is currently has prominence as a light source useful for various products.

In an LED-using light emitting device, a technique using phosphors is widely employed in order to convert light emitted from an LED chip into light of a different wavelength. More particularly, such a wavelength conversion technique is required in order to generate white light used for various types of lighting apparatuses and the backlight units of display devices.

In a wavelength-converted light emitting device for the production of white light, phosphors are contained in a transparent resin encasing an LED chip to convert a portion of the original light emitted from the LED chip into secondary light of a different wavelength. The wavelength-converted light emitting device can produce white light by mixing an unconverted portion of the original light with the secondary light.

The transparent resin mixed with the phosphors is provided to surround the LED chip. In this case, the distribution of the phosphors provided to convert a light wavelength can have an influence on the brightness of emitted white light and the light spectrum. That is, when the phosphors are not uniformly distributed inside a resin encasing portion, light emitting efficiency deterioration and hue deviation by far field beam distribution may occur. In addition, when two or more kinds of phosphors (for example, a combination selected from yellow, green, an red phosphors) are used to improve a color rendering index (CRI), a problem due to the non-uniform distribution of phosphors may become more serious.

More particularly, in a light emitting device having a high flux LED driven by a high current, the distribution of irregular phosphors having a low reproduction rate has the disadvantage of accelerating the color conversion efficiency reduction rate and the reliability reduction rate to an even greater degree.

DISCLOSURE

Technical Problem

An aspect of the present invention provides a wavelength-converted LED chip that can reduce an influence of the distribution of phosphors and guarantee high reproduction of a wavelength conversion portion.

An aspect of the present invention also provides a wavelength-converted light emitting device that can reduce an influence of the distribution of phosphors and guarantee high reproduction of a wavelength conversion portion.

An aspect of the present invention also provides a method for manufacturing a wavelength-converted light emitting device that can reduce an influence of the distribution of phosphors and guarantee the high reproducibility of a wavelength conversion portion.

Technical Solution

According to an aspect of the present invention, there is provided a wavelength-converted light emitting diode (LED) chip including: an LED chip for emitting light in a predetermined wavelength region; and a wavelength-converted layer formed of a resin containing phosphors of at least one kind which convert a portion of the light emitted from the LED chip into light in a different wavelength region, formed on an upper surface of the LED chip, and having a convex meniscus-shaped upper surface.

An edge of the wavelength-converted layer may be defined along an upper edge of the LED chip.

The resin containing the phosphors may have one of hydrophobicity and hydrophilicity, and the upper surface of the LED chip may be a surface having the same characteristic as that of the resin.

The wavelength-converted LED chip may further include a surface modification layer formed on the upper surface of the LED chip and having the same characteristic as that of the resin. The surface modification layer may be provided as a passivation layer for the LED chip.

A plurality of uneven portions may be formed in the upper surface of the LED chip.

The wavelength-converted layer may further contain an additive for controlling one of viscosity and thixotropy of the resin containing the phosphors.

The resin forming the wavelength-converted layer may be one of a silicon-based resin, an epoxy-based resin, an acryl-based resin, a poly methyl methacrylate (PMMA) resin, a mixture thereof, and a compound thereof.

The predetermined wavelength region primarily used for realizing white light as final light may be one of a wavelength region of an ultraviolet ray, blue, and green, a wavelength region of blue and green, a wavelength region of an ultraviolet ray and blue, a wavelength region of an ultraviolet ray, a wavelength region of blue, and a wavelength region of green.

The phosphors of the at least one kind may be phosphors of various kinds for converting light in the predetermined wavelength region into light in different wavelength regions.

The wavelength-converted layer may have at least two resin layers containing the different phosphors, respectively.

The at least two resin layers may include a first resin layer containing first phosphors and a second resin layer containing at least one second phosphor, the first resin layer may have a first convex meniscus-shaped upper surface located in an inner region on the upper surface of the LED chip, and the second resin layer may be formed on the first resin layer and have a second convex meniscus-shaped upper surface whose boundary is defined by an edge of the upper surface of the LED chip.

Light converted by the first phosphors may have a shorter wavelength than that of light converted by the second phosphors. A peak wavelength of the light emitted from the LED chip may be in the range of about 380 to 500 nm, the first phosphors may include green phosphors for converting the light into green light, and the second phosphors may include red phosphors for converting the light into red light.

The first phosphors may include the green phosphors at a weight % of about 20 to 80% in the resin, and the second phosphors may include the red phosphors at a weight % of about 5 to 30% in the resin.

A peak wavelength of the light emitted from the LED chip may be in the range of about 380 to 500 nm, the first phosphors may include green phosphors for converting the light into green light, and the second phosphors may include red phosphors for converting the light into red light, and yellow phosphors for converting the light into yellow light.

The first phosphors may include the green phosphors at a weight % of about 5 to 60% in the resin, and the second phosphors may include the red phosphors at a weight % of about 2 to 25%, and the yellow phosphors at a weight % of about 15 to 80% in the resin.

According to another aspect of the present invention, there is provided a wavelength-converted light emitting device including: a member for mounting, having first and second lead structures; a light emitting diode (LED) chip mounted on the member for mounting so that the LED chip is electrically connected to the first and second lead structures, for emitting light in a predetermined wavelength region; and a wavelength-converted layer formed of a resin containing phosphors of at least one kind which convert a portion of the light emitted from the LED chip into light in a different wavelength region, formed on an upper surface of the LED chip, and having a convex meniscus-shaped upper surface.

The LED chip may be electrically connected with at least one of the first and second lead structures using a wire.

A maximum thickness of the wavelength-converted layer may be less than a length between the upper surface of the LED chip and a height of the wire.

A wavelength-converted light emitting device may further include a lens-shaped structure formed on the member for mounting.

According to still another aspect of the present invention, there is provided a method for manufacturing a wavelength-converted light emitting device, the method including: mounting a light emitting diode (LED) chip for emitting light in a predetermined wavelength region on a member for mounting, having first and second lead structures such that the LED chip is electrically connected to the first and second lead structures; preparing a liquid resin containing phosphors of at least one kind, for converting a portion of light emitted from the LED chip into light in a different wavelength region; providing the liquid resin containing the phosphors on an upper surface of the LED chip such that the liquid resin has a structure of a convex meniscus-shaped upper surface on the upper surface of the mounted LED chip; and forming a wavelength-converted layer on the upper surface of the LED chip by curing the liquid resin containing the phosphors to maintain the structure.

The structure of the convex meniscus-shaped upper surface may be defined by an upper edge of the LED chip. The providing of the liquid resin containing the phosphors may be performed using a dispensing process.

The mounting of the LED chip may include electrically connecting the LED chip to at least one of the first and second lead structures using a wire. The providing of the liquid resin containing the phosphors may be performed after the connecting of the LED chip using the wire.

A maximum thickness of the wavelength-converted layer may be less than a length between the upper surface of the LED chip and a height of the wire.

The preparing of the liquid resin containing the phosphors may include optimizing one of viscosity and thixotropy of the resin containing the phosphors using at least one of viscosity of the liquid resin, granularity of phosphors, phosphor content, and content of an additive for controlling viscosity so that the liquid resin provided on the upper surface of the LED chip has the structure of the convex meniscus-shaped upper surface.

Advantageous Effects

According to exemplary embodiments of the invention, a phosphor layer is provided on the upper surface of an LED chip, so that a problem associated with non-uniform distribution of phosphors and color reproduction may be addressed. In addition, the phosphor layer on the upper surface of the LED chip may be provided such that the phosphor layer has a dome-like convex meniscus shape. Such a shape can be obtained by controlling a relatively simple process element such as optimization of the viscosity or thixotropy of a resin mixed with phosphors. By doing so, it is possible to control far field beam distribution and hue deviation caused by the far field beam distribution on the upper surface of the LED chip.

In addition, not only color conversion efficiency of white light may be maximized but also a CRI may be improved using a double-layered structure.

MODE FOR INVENTION

The above and other aspects, features and other advantages of the present invention will be more clearly understood from the following detailed description taken in conjunction with the accompanying drawings.

Figure 1:
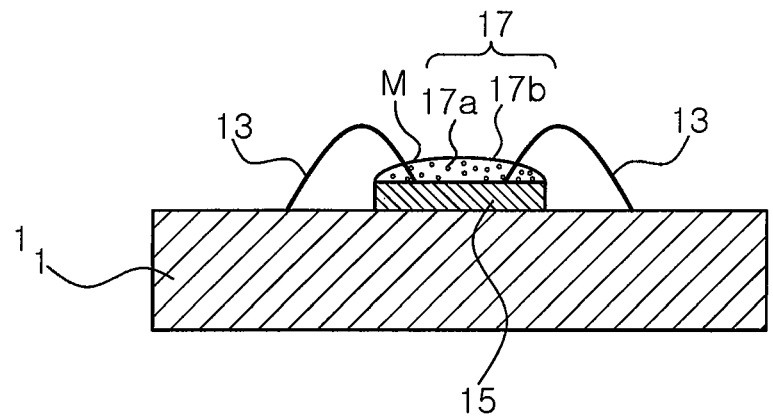
FIG. 1 is a schematic cross-sectional view illustrating a wavelength-converted light emitting device according to an exemplary embodiment of the present invention.

FIG. 1 is a schematic cross-sectional view illustrating a wavelength-converted light emitting device 10 according to an exemplary embodiment of the present invention.

Referring to FIG. 1, the wavelength-converted light emitting device 10 includes a substrate 11 which is a member for mounting, and an LED chip 15 mounted on the substrate 11.

In an exemplary embodiment of the present invention, the LED chip 15 may be fixed on the substrate using an additive member (not shown), and may be electrically connected with lead structures (not shown) of the substrate 11 using wires 13.

A phosphor layer 17 having a convex meniscus-shaped upper surface M is formed on the upper surface of the LED chip 15. The phosphor layer 17 is formed of a resin 17b containing phosphors 17a for converting a portion of light emitted from the LED chip 15 into light in a different wavelength band.

In an exemplary embodiment for providing white light as final light, the wavelength band of light emitted from the LED chip 15 may be an ultraviolet (UV) wavelength region, a blue wavelength region, or a green wavelength region. Also, the wavelength band may be a wavelength region of an ultraviolet ray, blue and green, a wavelength region of blue and green, or a wavelength region of an ultraviolet ray and blue where a wavelength region is widely distributed.

For example, the LED chip 15 may be a UV or blue LED chip having a peak wavelength of about 380 to 500 nm.

The phosphors 17a may be phosphors of at least one kind that can convert the light emitted from the LED chip 15 into light in a different wavelength region. That is, phosphors of one kind which can convert the light into yellow light may be used, or a combination of phosphors of two or more kinds may be used. For example, a combination of red phosphors and green phosphors, or a combination of yellow phosphors and green phosphors may be used. As the number of combinations of phosphors increases, relatively high CRI can be expected.

In addition, the resin 17b for the wavelength-converted layer 17 may be one of a silicon-based resin, an epoxy-based resin, an acryl-based resin, a poly methyl methacrylate (PMMA) resin, a mixture thereof, and a compound thereof.

Here, the "mixture" denotes a physical mixing of at least two resins selected from the above-described resins. The "compound" denotes a synthesis of at least two selected resins through a chemical bond. For example, the compound may include a silicon resin having a silicon atom-coupled hydroxyl group, and a silicon epoxy compound resin in which an epoxy resin having an oxirane group is synthesized.

As illustrated in FIG. 1, since the phosphor layer 17 is limited to the upper surface of the LED chip 15, a more uniform phosphor distribution can be guaranteed in comparison to phosphor layer surrounding the entire area of the chip. In addition, since the upper surface of the LED chip 15 is provided as a primary light emission surface, even when the phosphor layer 17 is formed on only the upper surface of the chip 15, a sufficient light conversion effect can be obtained.

In an exemplary embodiment of the present invention, the phosphor layer 17 has a convex meniscus-shaped upper surface. The convex meniscus structure can provide useful advantages in an aspect of far field beam distribution and the hue distribution of light emitted from the phosphor layer 17. The convex meniscus structure adapted to an exemplary embodiment of the present invention can be obtained by using the surface tension of a liquid resin containing in advance the phosphors 17a. In addition, the convex meniscus structure can be controlled using a condition such as the viscosity and the thixotropy of the phosphor containing liquid resin.

More particularly, during a process for forming the phosphor layer using the liquid resin, the boundary of a structure having a convex meniscus shape for the phosphor layer 17 can be defined by the upper edge of the LED chip 15. In this case, the phosphor layer 17 can be formed such that high structural reproducibility is achieved in a desired region (the upper surface of the chip).

In an exemplary embodiment of the present invention, the meniscus shape adapted as the structure of the phosphor layer 15 may be easily modified and designed by controlling some of process factors with consideration of desired far field beam distribution and hue distribution.

More particularly, as a simple method for obtaining a desired meniscus shape, a method of controlling the viscosity or the thixotropy of the phosphor containing liquid resin may be employed.

The viscosity or the thixotropy of the phosphor containing liquid resin can be controlled by not only the viscosity itself of a transparent resin used but also the content and/or granularity of the phosphors added to the resin. In addition, the controlling of the viscosity of the phosphor containing liquid resin may be realized using an additional additive, which will be described in more detail with reference to FIG. 4.

Besides the above-described method of controlling the structure of the phosphor layer, a desired convex meniscus structure can be formed on the upper surface of the chip using a different approach with stability and high reproducibility.

As for this approach, a method of changing a surface state of the upper surface of the LED chip may be used for example, which will be described in more detail with reference to FIGS. 2 and 3.

Figure 2:
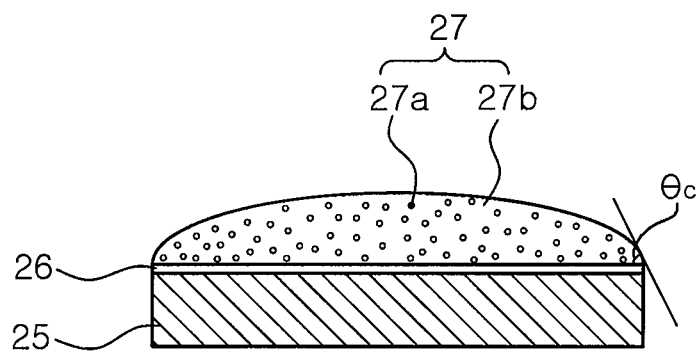
FIG. 2 is a schematic cross-sectional view illustrating an improvement of a wavelength-converted LED chip according to an exemplary embodiment of the present invention.

A wavelength-converted LED chip illustrated in FIG. 2 includes an LED chip 25 and a surface modification layer 26 formed on the upper surface of the LED chip 25. A phosphor layer 27 is formed on the surface modification layer 26. The phosphor layer 27 includes a transparent phosphor resin 27b and phosphors 27a of at least one kind contained therein.

In an exemplary embodiment of the present invention, for the surface modification layer 26, a material having the same physical property as that (hydrophobicity or hydrophilicity) of a liquid resin for the phosphor layer 27 is selected.

For example, when the resin for the phosphor layer 27 is a hydrophobic liquid resin such as a silicon-based resin, a hydrophobic material such as a silicon nitride layer (SiNx) is formed in advance on the upper surface of the LED chip 25 on which the phosphor layer 27 is to be formed.

The surface modification layer 26 can provide a meniscus shape such that the meniscus shape has a relatively high contact angle c by reducing the wettability of the phosphor containing resin on the upper surface of the LED chip 25. As described above, the surface modification layer 26 adapted to an exemplary embodiment of the present invention assists the phosphor layer 27 to stably maintain the convex meniscus shape.

In addition, when the surface modification layer 26 is a material having electrical insulation properties, the surface modification layer 26 may be provided as a passivation layer including the LED chip 25. In this case, the surface modification layer 26 may additionally be formed on a different region besides the upper surface of the LED chip 25.

Though the surface modification layer 26 is formed by adding a separate layer in an exemplary embodiment of FIG. 2, the surface modification layer 26 may be realized to have the same physical property (hydrophobicity or hydrophilicity) as that of the phosphor containing resin by performing surface treatment on the upper surface of the LED chip 25 on which the phosphor layer 27 is to be formed.

Figure 3:
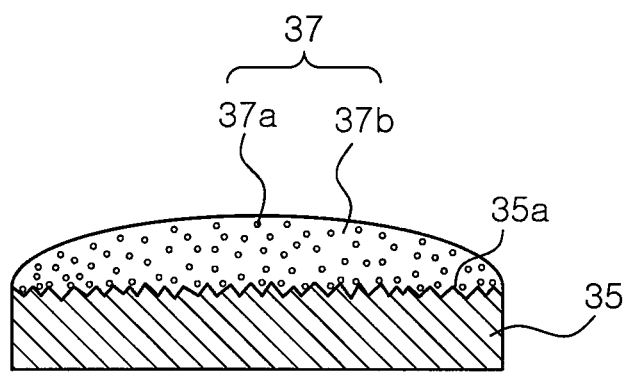
FIG. 3 is a schematic cross-sectional view illustrating an improvement of a wavelength-converted LED chip according to an exemplary embodiment of the present invention.

Unlike this, referring to FIG. 3, a wavelength-converted LED chip 30 includes an LED chip 35 having an upper surface in which uneven portions 35a are formed, and a phosphor layer 37 formed on the upper surface. The phosphor layer 37 includes a transparent phosphor resin 37b and phosphors 37a of at least one kind contained therein.

In an exemplary embodiment of the present invention, a contact area of the surface on which the phosphor layer 37 is to be formed may be increased using the uneven portions. Therefore, the uneven portions 35a not only assist in the formation of a convex meniscus structure by delaying the flow of a liquid resin on the upper surface of the LED chip 35, but they also improve adhesive strength with the phosphor layer 37. The uneven portions 35a, adaptable to an exemplary embodiment of the present invention, may be uneven portions by wet etching and is not limited thereto.

FIGS. 4A through 4D are cross-sectional views for each primary process, illustrating a method for manufacturing a wavelength-converted light emitting device according to an exemplary embodiment of the present invention.

Figure 4A:
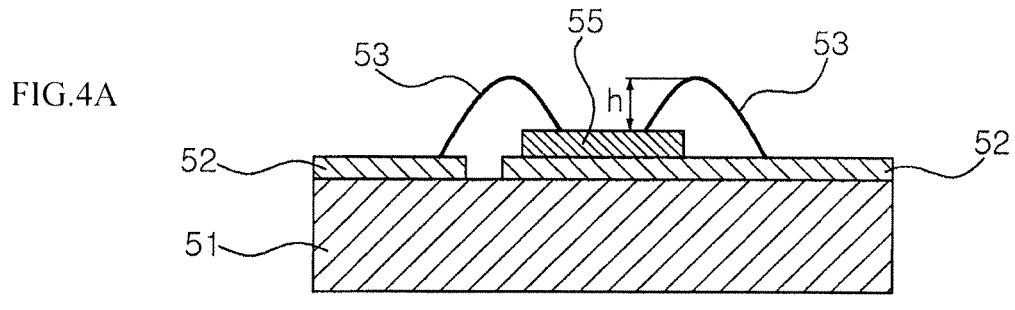
FIGS. 4A, 4B, 4C and 4D are cross-sectional views for each primary process illustrating a method for manufacturing a wavelength-converted light emitting device according to an exemplary embodiment of the present invention.

Referring to FIG. 4A, the method for manufacturing the wavelength-converted light emitting device starts by mounting an LED chip 55 for emitting light in a specific wavelength region on a member 51 for mounting.

The member 51 for mounting includes first and second lead structures 52 that can provide external connection terminals. The mounted LED chip 55 may be electrically connected to the first and second lead structures 52 so that the LED chip 55 is driven. Unlike the above-described exemplary embodiment of the present invention, wire bonding may be applied to only the electrical connection of an electrode on one side, or all electrical connection may be realized by flip-chip bonding without wire bonding, depending on the electrode structure of the LED chip.

In the case of applying wire bonding as in an exemplary embodiment of the present invention, the connection shapes and heights h of wires 53 may be suitably set so that an adverse influence is not generated by the wires 53 in forming a phosphor layer during a subsequent process. Here, the height h of the wire is defined by a length between the uppermost end of the wire and the upper surface of the mounted LED chip 55.

Figure 4B:
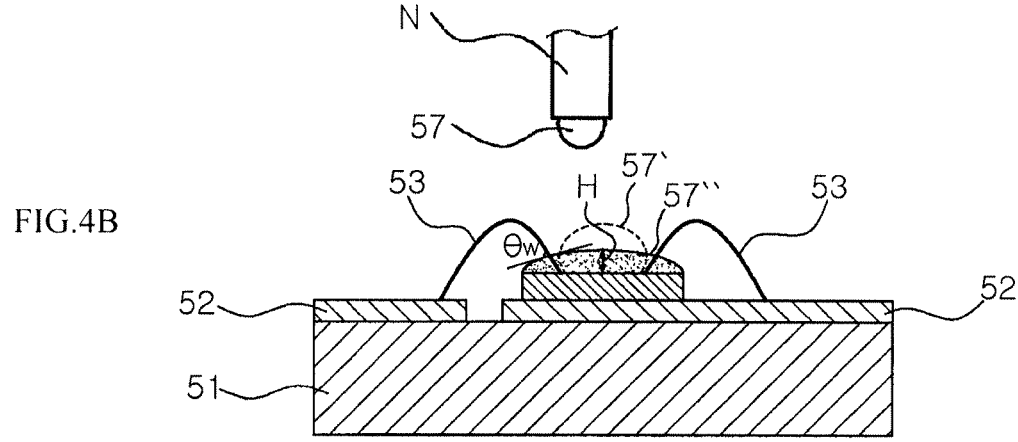

Next, as illustrated in FIG. 4B, a phosphor containing liquid resin 57 for forming a phosphor layer is prepared, and then the phosphor containing liquid resin 57 is provided on the upper surface of the LED chip 55, so that a structure 57" having a desired convex meniscus-shaped upper surface is formed.

The phosphor containing liquid resin 57 includes phosphors of at least one kind which convert light emitted from the LED chip 55 into light in a different wavelength region, and a transparent liquid resin containing the phosphors. The liquid resin may be one of a silicon-based resin, an epoxy-based resin, an acryl-based resin, a poly methyl methacrylate (PMMA) resin, a mixture thereof, and a compound thereof.

The liquid resin 57 may be provided on the upper surface of the LED chip 55. The providing of the liquid resin 57 may be performed using at least one of dispensing, screen printing, spray coating, and the like. More particularly, the dispending process has the advantage of easily realizing a desired meniscus curve by sufficiently using the surface tension of the liquid resin.

An exemplary process of FIG. 4B illustrates a dispensing process. As illustrated in FIG. 4B, a droplet 57' provided on the upper surface of the LED chip 55 using a nozzle N spreads on the upper surface of the chip to have the desired convex meniscus structure 57" due to surface tension.

At this point, the desired convex meniscus structure 57" can be provided and limited to the upper surface of the chip by controlling an amount of provided droplets and the viscosity of the liquid resin. More particularly, the far field beam distribution and hue distribution can be controlled by changing the convex meniscus structure formed on the upper surface of the chip 55 depending on the viscosity or thixotropy of the liquid resin.

The viscosity of the phosphor containing resin can be controlled by not only the viscosity itself of a transparent resin used but also a content and/or a granularity of the phosphors contained therein. For example, in the case that the content of phosphors is high and the granularity of the phosphors is low, the viscosity and thixotropy of the phosphor containing resin can be raised. Consequently, the curvature of the meniscus shape will increase due to greater surface tension. In the opposite case, a phosphor layer having a meniscus shape of a small curvature or contact angle can be obtained.

In addition, the controlling of the viscosity or thixotropy of the phosphor containing liquid resin may be realized using an additional additive. For example, the viscosity or thixotropy of the phosphor containing liquid resin can be increased by mixing and additional powder such as $SiO_2$ or $TiO_2$ with the transparent resin.

As described above, the shape and the height of the wire 53 may be controlled so that provided droplets do not flow outside the upper surface of the chip 55 and a desired convex meniscus structure is formed. In the operation of FIG. 4A, the wire 53 may be formed, in advance, to have a higher height h than the height of the meniscus structure 57' for the phosphor layer. In addition, a wire drawing angle w may be about 45° from the plane of the meniscus structure contacting the wire.

Figure 4C:
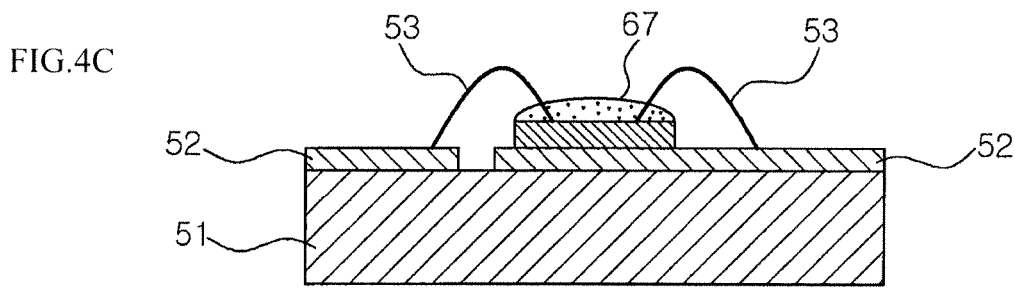

Subsequently, as illustrated in FIG. 4C, the phosphor containing liquid resin 57" is cured to maintain the meniscus structure. By doing so, a wavelength-converted layer 67 can be formed on the upper surface of the LED chip.

Before this curing process, as illustrated in FIG. 4B, the phosphor containing liquid resin 57' provided on the upper surface of the chip 55 flows and transforms to have the convex meniscus structure 57". At this point, the phosphor containing liquid resin 57' flows to arrive at the upper edge of the chip 55 in the boundary of the convex meniscus structure 57", change in the structure of the liquid resin on the upper surface of the chip becomes remarkably slow, and the change may be almost terminated by viscosity control of the liquid droplet.

As described above, the boundary of the convex meniscus structure can be defined by the upper edge of the LED chip 55, and the phosphor layer 67 limited by the upper surface of the chip 55 as illustrated in FIG. 4C may be provided by applying the curing process. In addition, the reproducibility of the structure of the phosphor layer 67 may be raised.

Figure 4D:
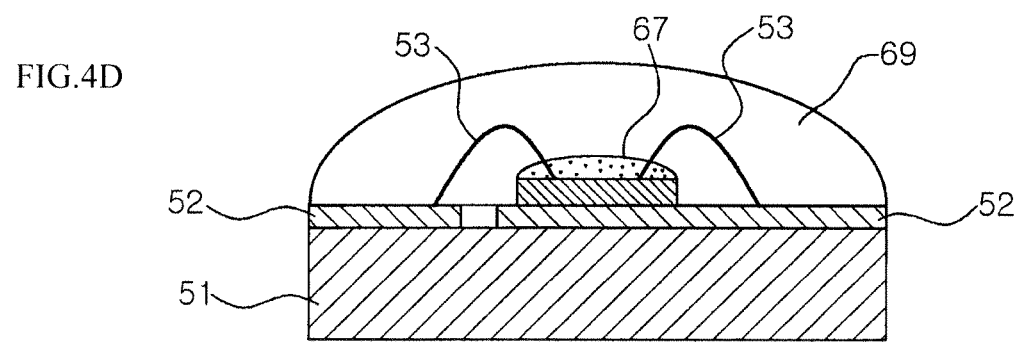

If necessary, as illustrated in FIG. 4D, a lens-shaped structure 69 may be additionally formed on the member for mounting in order to protect the LED chip 55 on which the phosphor layer 67 is formed. The lens-shaped structure may be provided as a resin encasing portion formed of silicon, epoxy, or a mixture thereof, and may improve a light characteristic and control far field beam distribution.

Figure 5:
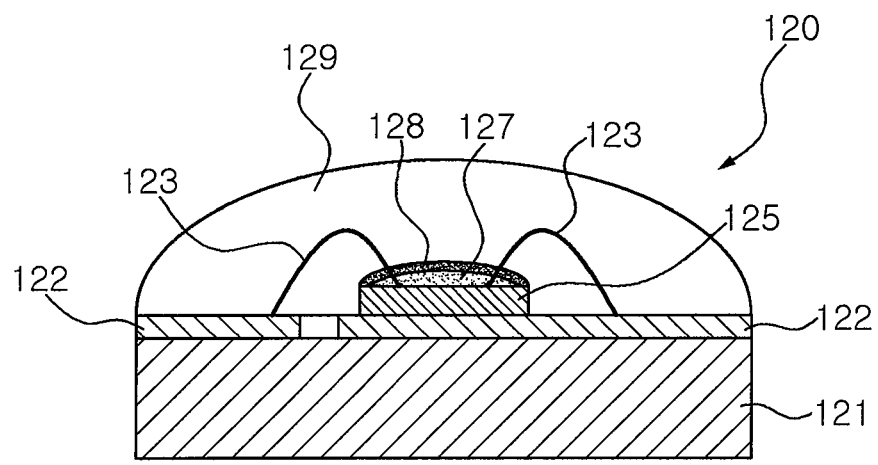
FIG. 5 is a schematic cross-sectional view illustrating a wavelength-converted light emitting device according to an exemplary embodiment of the present invention.
Figure 6:
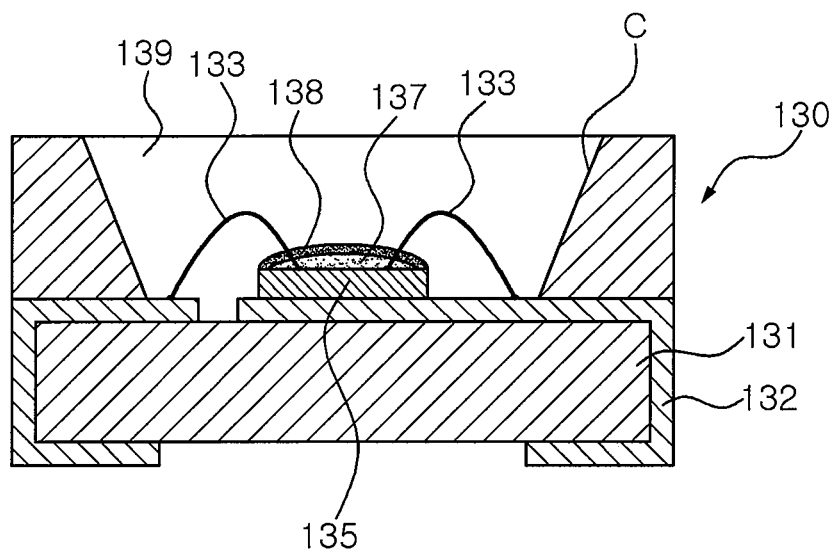
FIG. 6 is a schematic cross-sectional view illustrating a wavelength-converted light emitting device according to an exemplary embodiment of the present invention.

An exemplary embodiment of the present invention provides a double-layered structure, which is exemplarily illustrated in FIGS. 5 and 6.

FIG. 5 is a schematic cross-sectional view illustrating a wavelength-converted light emitting device according to an exemplary embodiment of the present invention.

Referring to FIG. 5, the wavelength-converted light emitting device 120 includes a substrate 121 which is a member for mounting, and an LED chip 125 mounted on the substrate 121. The LED chip 125 may be electrically connected with lead structures 122 of the substrate 121 using wires 123.

A phosphor layer 127 and 128 of a double-layered structure having a convex meniscus-shaped upper surface is formed on the upper surface of the LED chip 125. A first resin layer 127 contains first phosphors and has a first convex meniscus-shaped upper surface located in an inner region on the upper surface of the LED chip 125. A second resin layer 128 is formed on the first resin layer 127, contains second phosphors, and has a second convex meniscus-shaped upper surface. Here, the outer boundary of the second resin layer 128 may be defined along the upper edge of the LED chip 125.

In this case, light converted by the first phosphors may have shorter wavelength than the wavelength of light converted by the second phosphors with consideration of phosphor conversion efficiency on the whole.

Specifically, to realize white light, when the peak wavelength of light emitted from the LED chip 125 is in the range of about 380 to 500 nm, the first phosphors may include green phosphors for converting the light into green light, and the second phosphors may include red phosphors for converting the light into red light. In this case, the first phosphors may include the green phosphors at a weight % of about 20 to 80% in the resin, and the second phosphors may include the red phosphors at a weight % of about 5 to 30% in the resin.

Unlike this, the second phosphors may include red phosphors for converting the light into red light and yellow phosphors for converting the light into yellow light. Such a combination can guarantee greater CRI than that of the former exemplary embodiment of the present invention. In this case, the first phosphors may include the green phosphors at a weight % of about 5 to 60% in the resin, and the second phosphors may include the red phosphors at a weight % of about 2 to 25%, and the yellow phosphors at a weight % of about 15 to 80% in the resin.

Here, the green light has a wavelength band of about 450 to 630 nm, the red light has a wavelength band of about 550 to 750 nm, and the yellow light has a wavelength band of about 480 to 680 nm.

In addition, phosphors according to the above combination are uniformly distributed inside the transparent resins of the first and second phosphor resin layers 127 and 128. The outer surfaces of the first and second phosphor resin layers 127 and 128 form a meniscus curve due to the surface tension, viscosity, or thixotropy of the liquid resin before curing. That is, the outer surfaces may have convex dome shapes. The viscosity of the transparent liquid resin used for an exemplary embodiment may be about 500 to 2500 cps.

In addition, as illustrated in FIG. 5, a lens-shaped structure 129 may be formed on the member 121 for mounting to surround the LED chip 125 and the wires 123. The lens-shaped structure 129 may be formed of a silicon resin, an epoxy resin, or a mixture thereof. As illustrated, the lens-shaped structure 129 may be provided in a lens shape to improve a light characteristic and control far field beam distribution.

FIG. 6 is a schematic cross-sectional view illustrating a wavelength-converted light emitting device according to an exemplary embodiment of the present invention.

As illustrated in FIG. 6, the wavelength-converted light emitting device 130 includes a substrate 131 which is a member for mounting, and an LED chip 135 mounted on the substrate 131.

The member 131 for mounting adapted to an exemplary embodiment of the present invention has a recess C for surrounding the LED chip 135. A reflective layer (not shown) may be formed on the inner wall of the recess. The LED chip 135 may be electrically connected with ead structures 132 of the substrate 131 using wires 133.

Phosphor layers 137 and 138 adapted to an exemplary embodiment of the present invention may be understood as a similar structure to the double-layered phosphor layer 127 and 128 of FIG. 5. That is, the first resin layer 137 contains first phosphors and has a first convex meniscus-shaped upper surface located in an inner region on the upper surface of the LED chip 135. The second resin layer 138 is formed on the first resin layer 137, contains second phosphors, and has a second convex meniscus-shaped upper surface. Here, the outer boundary of the second resin layer 138 may be defined along the upper edge of the LED chip 135. The first phosphors and the second phosphors provide light of different wavelengths, respectively. Light converted by the first phosphors may have a shorter wavelength than the wavelength of light converted by the second phosphors.

As described above, phosphors of different kinds are separated such that they are not mixed with one another, so that light absorption problem between the phosphors which may occur in the case where various phosphors are mixed together may be addressed, and light emitted from the LED chip may be configured to pass through all the phosphors. Furthermore, color conversion efficiency and CRI of finally converted white light may improve.

While the present invention has been shown and described in connection with the exemplary embodiments, it will be apparent to those skilled in the art that modifications and variations can be made without departing from the spirit and scope of the invention as defined by the appended claims.

The invention claimed is:

1. A wavelength-converted light emitting diode (LED) chip comprising:
   an LED chip for emitting light in a predetermined wavelength region; and
   a wavelength-converted layer formed of a resin containing phosphors of at least one kind which converts a portion of the light emitted from the LED chip into light in a different wavelength region, disposed on an upper surface of the LED chip, and having a convex meniscus-shaped upper surface whose boundary is defined by an edge of the upper surface of the LED chip,
   wherein a plurality of uneven portions are formed in the upper surface of the LED chip,
   wherein the phosphors of the at least one kind comprise phosphors of various kinds for converting light in the predetermined wavelength region into light in different wavelength regions,
   wherein the wavelength-converted layer comprises at least two resin layers containing the different phosphors, respectively, and
   wherein the at least two resin layers comprise a first resin layer containing first phosphors and a second resin layer containing at least one second phosphor,
   the first resin layer comprises a first convex meniscus-shaped upper surface located in an inner region on the upper surface of the LED chip, and the second resin layer is formed on the first resin layer and comprises a second convex meniscus-shaped upper surface whose boundary is defined by an edge of the upper surface of the LED chip.

2. The wavelength-converted LED chip of claim 1, wherein light converted by the first phosphors has a shorter wavelength than that of light converted by the second phosphors.

3. The wavelength-converted LED chip of claim 1, wherein a peak wavelength of the light emitted from the LED chip is in the range of about 380 to 500 nm, the first phosphors comprise green phosphors for converting the light into green light, and the second phosphors comprise red phosphors for converting the light into red light.

4. The wavelength-converted LED chip of claim 3, wherein the first phosphors comprise the green phosphors at a weight % of about 20 to 80% in the resin, and the second phosphors comprise the red phosphors at a weight % of about 5 to 30% in the resin.

5. The wavelength-converted LED chip of claim 2, wherein a peak wavelength of the light emitted from the LED chip is in the range of about 380 to 500 nm, the first phosphors comprise green phosphors for converting the light into green light, and the second phosphors comprise red phosphors for converting the light into red light, and yellow phosphors for converting the light into yellow light.

6. The wavelength-converted LED chip of claim 5, wherein the first phosphors comprise the green phosphors at a weight % of about 5 to 60% in the resin, and the second phosphors comprise the red phosphors at a weight % of about 2 to 25%, and the yellow phosphors at a weight % of about 15 to 80% in the resin.

* * * * *